(12) United States Patent
Murari

(10) Patent No.: US 8,674,726 B2
(45) Date of Patent: Mar. 18, 2014

(54) MULTI-LEVEL CHIP INPUT CIRCUIT

(75) Inventor: Sharad Murari, Gilbert, AZ (US)

(73) Assignee: NXP B.V., Eindhoven (NL)

( * ) Notice: Subject to any disclaimer, the term of this patent is extended or adjusted under 35 U.S.C. 154(b) by 46 days.

(21) Appl. No.: 13/469,704

(22) Filed: May 11, 2012

(65) Prior Publication Data

US 2013/0127512 A1   May 23, 2013

Related U.S. Application Data

(63) Continuation-in-part of application No. 12/790,362, filed on May 28, 2010.

(51) Int. Cl.
*H03K 5/153* (2006.01)
(52) U.S. Cl.
USPC ................... 327/74; 327/75; 327/76; 326/37; 326/38
(58) Field of Classification Search
USPC .................................. 327/74–76; 326/37, 38
See application file for complete search history.

(56) References Cited

U.S. PATENT DOCUMENTS

| | | | |
|---|---|---|---|
| 6,477,205 B1 | 11/2002 | Doblar | |
| 6,611,222 B1 | 8/2003 | Murphy | |
| 7,061,421 B1 | 6/2006 | Xiao | |
| 7,138,824 B1 | 11/2006 | Bakker | |
| 7,245,148 B2 | 7/2007 | Awalt | |
| 7,486,106 B1* | 2/2009 | Camarota | 326/33 |
| 8,045,353 B2* | 10/2011 | Bansal | 363/147 |
| 8,129,969 B1* | 3/2012 | Chui et al. | 323/283 |

FOREIGN PATENT DOCUMENTS

| | | | |
|---|---|---|---|
| JP | 61066590 A | 4/1986 | |
| JP | 8190963 A | 7/1996 | |

OTHER PUBLICATIONS

Extended European Search Report (from EP counterpart to parent application), Oct. 6, 2011, EPO.

* cited by examiner

Primary Examiner — Kenneth B. Wells

(57) ABSTRACT

Aspects of the instant disclosure are directed toward apparatuses that generate a power-related adjustment signal in response to the power signal. Digital-input-signal pads are included to communicate digital signals with a circuit external to the apparatus. Further, digital-input processing circuitry receives the digital signals from the digital-input-signal pad, and processes the received digital signals. Additionally, configuration circuitry applies the power-related adjustment signal to signals received at the digital-input-signal pad and, in response, detects the digital signals received.

20 Claims, 10 Drawing Sheets

MULTI-LEVEL CHIP INPUT CIRCUIT

This patent document is a continuation-in-part under 35 U.S.C. §120 of U.S. patent application Ser. No. 12/790,362 filed on May 28, 2010; this patent document is incorporated herein in its entirety for subject matter which is common.

Many early electronic circuits and related systems incorporated two or more levels of logic, some with complete variability, using analog inputs and outputs. As digital systems were introduced and increased in capability (e.g., storage, speed, input/output capabilities), binary inputs and outputs were used. Modern system communications have since evolved to using digital signals, including static configuration and other static information signals.

In many applications, circuits desirably operate using different types of inputs, and under different operational conditions. For such circuits, it has often been necessary to use redundant components, such as input pins, for connecting to different types of input circuits.

In many circuit applications, compact size and efficiency are highly desirable. For example, as relative to many applications including those involving programmable circuits requiring or benefiting from operation with different types of input circuits, it is often desirable to package circuits in small areas for implementation with relatively compact devices. In addition, reducing the required size of circuits can be helpful for cost reduction.

Many circuits are not readily amenable to compact arrangements and efficient manufacture and operation. For example, many circuits are desirably applicable for implementation with a wide variety of different types of devices. To do so, such circuits must be configurable for specific operational characteristics. This configurability can introduce added complexity and cost to the circuits.

These challenges can make it difficult to achieve desirable circuit and package sizes while also ensuring proper circuit operation. In connection with various example embodiments, an input circuit facilitates various configurations, in a manner that addresses challenges for a variety of applications and devices, such as those discussed above. Aspects of the instant disclosure detect digital signals received at an input, and convey information by decoding several states of information and at least two additional states of information regarding the signals generated by circuits connected at the input.

Aspects of the instant disclosure are directed towards input circuitry that facilitates various configurations, and allows for detection utilizing quinary states.

For instance, aspects of the instant disclosure are directed towards apparatuses having an integrated circuit (IC), a digital-input-signal pad, digital-input processing circuitry, and configuration circuitry. The integrated circuits have a power terminal that is connected to receive a power signal, and a circuit-type decoding circuit that includes a signal-adjust circuit that generates a power-related adjustment signal (in response to the power signal). The digital-input-signal pad is configured for communicating digital signals between the integrated circuit and another circuit that is external to the integrated circuit. The digital-input processing circuit, which is within the IC and includes binary logic circuitry, is configured for receiving the digital signals from the digital-input-signal pad. Further, the digital-input processing circuit is designed to process the received digital signals, using the binary logical circuit. The configuration circuitry is configured for applying the power-related adjustment signal to signals received at the digital-input-signal pad. In response thereto, the configuration circuit detects that the digital signals received at the digital-input-signal pad convey information using a first group of several states of information and at least two additional states of information. Additionally, more than the several states of information are decoded, by the configuration circuitry, from the information conveyed over the digital-input-signal pad.

Aspects of the instant disclosure are additionally directed towards apparatuses having an integrated circuit (IC), a digital-input-signal pad, digital-input processing circuitry, and configuration circuitry, as described in detail above. The configuration circuitry is configured and arranged with the digital-input-signal pad and digital-input processing circuitry to decode at least the four states of information from the information conveyed over the at least one digital-input-signal pad and facilitate identification of the other circuit. The four states of information include a high-level input state; a low-level input state; a low-ohmic input state; and a high-ohmic input state.

Further aspects of the instant disclosure include apparatuses having an integrated circuit (IC), two digital-input-signal pads, digital-input processing circuitry, and configuration circuitry. The configuration circuitry is configured and arranged with the digital-input-signal pads and digital-input processing circuitry to decode at least four states of information from the information conveyed over the first digital-input-signal pad. Additionally, the second digital-input-signal pad multiplies the four states of information decoded from the information conveyed over the first digital-input-signal pad.

Further, aspects of the instant disclosure utilizing two or more quinary inputs are shorted together to increase the number of values that can be detected. For the two quinary (five state decode) two inputs, twenty-five possible values are detectable, and the ability to short the inputs, and detect the short, allows for thirty possible detectable values (increases the number of states by 20%). Further, aspects of the instant disclosure extend the number of values that can be detected when two or more pads are present without the need for additional logic by adding an extra detection state which detects if two inputs are connected together (in addition to having the five allowed quinary states).

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 1:
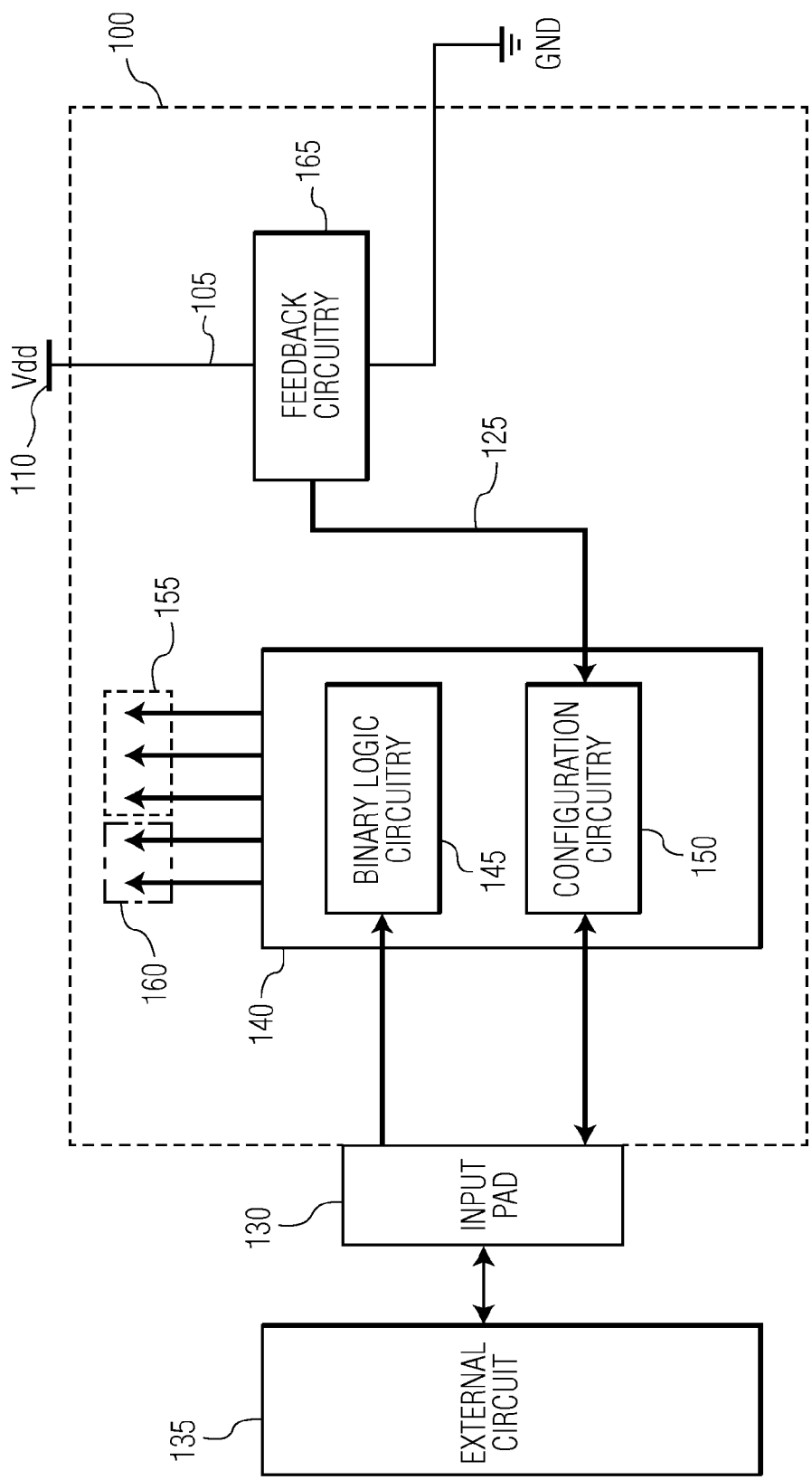
FIG. 1 shows an example embodiment of an apparatus, in accordance with aspects of the instant disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims.

The present invention is believed to be applicable to a variety of different types of input circuits, programmable chips, devices and related arrangements. While the present invention is not necessarily so limited, various aspects of the invention may be appreciated through a discussion of examples using this context.

In connection with various example embodiments, aspects of the instant disclosure are directed towards apparatuses having an integrated circuit (IC), at least one digital-input-signal pad, digital-input processing circuitry, and configuration circuitry. The integrated circuit included in the apparatus of the instant disclosure has a power terminal that is connected to receive a power signal as well as a circuit-type decoding circuit. The circuit-type decoding circuit includes a signal-adjust circuit that generates a power-related adjustment signal in response to the power signal. The digital-input-signal pad, included in the apparatuses, is provided for communicating digital signals between the integrated circuit and another circuit (which is external to the integrated circuit). The digital-input processing circuitry is within the IC and includes binary logic circuitry, and receives the digital-input signals from the digital-input-signal pad. The digital-input processing circuitry also is provided for processing the received digital signals using the binary logic circuitry. The configuration circuitry, included in apparatuses of the instant disclosure, applies the power-related adjustment signal to signals received at the digital-input-signal pad. Additionally, in response applying the power-related adjustment signal to signals received at the digital-input-signal pad, the configuration circuitry detects that the digital signals received convey information using a first group of several states of information, and at least two additional states of information. As a result, more than the several states of information are decoded from the information conveyed over the digital-input-signal pad. In certain embodiments, the several states of information includes a high-level input state; a low-level input state; a low-ohmic input state; and a high-ohmic input state.

In certain embodiments of the above describe apparatuses, the configuration circuitry includes analog circuitry which modulates by using the power-related adjustment signal to drive the digital-input-signal pad. Further, in other embodiments, the apparatus also includes an other circuit, which is external to the integrated circuit. Additionally, in some embodiments, the configuration circuit can be configured to apply the power-related adjustment signal to signals received at the digital-input-signal pad in order to discern whether the digital signals received at the digital-input-signal pad convey information using a total number of states corresponding to the number of the first group of several states multiplied by the number of said at least two additional states of information. In certain embodiments, the more than several states of information include: a floating input state; a high-level input state; a low-level input state; a low-ohmic input state; and a high-ohmic input state. Further, in other embodiments, the more than the several states of information include: a floating input state; a high-level state; a low-level state; a low-ohmic high-level input state; a high-ohmic high-level input state; a low-ohmic low-level input state; and a high-ohmic low-level input state.

Further, various embodiments of the above describe apparatuses are further characterized as having two digital-input-signal pads: a first digital-input-signal pad and a second digital-input-signal pad. Certain embodiments including two digital-input-signal pads are configured and arranged with the configuration circuitry and the digital-input processing circuitry such that first of the two digital-input-signal pads assesses the first group of several states of information, and the second of the digital-input-signal pads assesses the at least two additional states of information. Additionally, various embodiments have additional capabilities in that the configuration circuitry and the digital-input processing circuitry are configured and arranged to assess four states of information and to decode related information conveyed over the at least one digital-input-signal pad. In other embodiments, the configuration circuitry and the digital-input processing circuitry assess five states of information and decode related information conveyed over the at least one digital-input-signal pad.

Further embodiments of apparatuses of the instant disclosure include configuration circuitry and the digital-input processing circuitry designed with the a first digital-input-signal pad and a second digital-input-signal pad to decode four states of information from the information conveyed over the first digital-input-signal pad and the second digital-input-signal pad. Other embodiments of apparatuses have configuration circuitry and the digital-input processing circuitry designed with the a first digital-input-signal pad and a second digital-input-signal pad to decode five states of information from the information conveyed over the first digital-input-signal pad and the second digital-input-signal pad.

In certain embodiments, an apparatus has the other circuit external to the integrated circuit, and which is connected to the at least one digital-input-signal pad. Further, the binary logic circuitry has a plurality of amplifiers to facilitate decoding of one or more of at least four states by a voltage level of the signals received at the at least one digital-input-signal pad.

Additionally, further apparatuses of the instant disclosure are presented that have integrated circuitry, at least one digital-input-signal pad, digital-input processing circuitry, and configuration circuitry, similar to the circuitry described above. In these apparatuses, the digital-input-signal pad(s) are arranged with the configuration circuitry and the digital-input processing circuitry to apply a power-related adjustment signal to signals received at the digital-input-signal pads. In response applying the power-related adjustment signal to signals received at the digital-input-signal pads, the configuration circuitry is designed for detecting that the digital signals received at the at least one digital-input-signal pad convey information using a first group of several states of information and at least two additional states of information. From those groups of states, the configuration circuitry decodes more than the four states of information from the information conveyed over the at least one digital-input-signal pad and facilitate identification of the other circuit. The four states of information includes a high-level input state; a low-level input state; a low-ohmic input state; and a high-ohmic input state. In certain embodiments, the four states of information includes a fifth state. In those instances, the fifth state of information is a floating input state. Further, certain embodiments have binary logic circuitry that includes a plurality of amplifiers to facilitate decoding of one or more of at least four states by a voltage level of the signals received at the at least one digital-input-signal pad.

Additional aspects of the instant disclosure are directed towards apparatuses having integrated circuitry, two digital-input-signal pads, digital-input processing circuitry, and configuration circuitry. The circuitry is similar to the circuitry described above. The configuration circuitry is designed with the digital-input processing circuitry and the digital-input-signal pads to apply power-related adjustment signal to signals received at the first digital-input-signal pad and the second digital-input-signal pad and, in response thereto, for detecting that the digital signals received at the at least one digital-input-signal pad convey information using a first group of several states of information and at least two additional states of information. The configuration circuitry and the digital-input processing circuitry decodes more than the four states of information the information conveyed over the first digital-input-signal pad, and the second digital-input-signal pad multiplies the four states of information decoded from the information conveyed over the first digital-input-signal pad. In certain embodiments of apparatuses of the instant disclosure that include two digital-input-signal pads, binary logic circuitry, included in the digital-input processing circuitry, has a plurality of amplifiers to facilitate decoding of one or more of at least four states by a voltage level of the signals received at the first digital-input-signal pad and the second digital-input-signal pad.

Turning now to the figures, FIG. 1 shows an example embodiment of an apparatus, in accordance with aspects of the instant disclosure. FIG. 1 shows an apparatus, which includes an integrated circuit 100. The integrated circuit 100 has a power terminal 110 connected to receive a power signal 105. Additionally, the integrated circuit 100 includes a circuit-type decoding circuit, which has a signal-adjust circuit 165 configured and arranged to generate a power-related adjustment signal 125, in response to the power signal 105. The apparatus also includes a digital-input-signal pad 130 that communicates digital signals between the integrated circuit 100 and another circuit 135, which is external to the integrated circuit 100. Further, the apparatus includes digital-input processing circuitry 140 within the IC and that has binary logic circuitry 145 for receiving the digital signals from the digital-input-signal pad 130 and for processing the received digital signals using the binary logic circuitry 145. Configuration circuitry 150 is also included in the apparatus shown in FIG. 1. The configuration circuitry 150 is configured to apply the power-related adjustment signal 125 to signals received at the digital-input-signal pad 130, and in response, detect that the digital signals received at the digital-input-signal pad 130 convey information using a first group of several states of information 155, and at least two additional states of information 160, wherefrom, more than several states of information are decoded from the information conveyed over the digital-input-signal pad 130. In certain embodiments, the more than several states of information include: a floating input state; a high-level input state; a low-level input state; a low-ohmic input state; and a high-ohmic input state. Further, in other embodiments, the more than the several states of information include: a floating input state; a high-level state; a low-level state; a low-ohmic high-level input state; a high-ohmic high-level input state; a low-ohmic low-level input state; and a high-ohmic low-level input state.

In certain embodiments, the configuration circuitry 150 includes analog circuitry which modulates by using the power-related adjustment signal 125 to drive the digital-input-signal pad 130. Further, in other embodiments, the apparatus also includes an other circuit 135, which is external to the integrated circuit. Additionally, in some embodiments, the configuration circuit 150 can be configured to apply the power-related adjustment signal 125 to signals received at the digital-input-signal pad 130 in order to discern whether the digital signals received at the digital-input-signal pad 130 convey information using a total number of states corresponding to the number of the first group of several states multiplied by the number of said at least two additional states of information.

Moreover, certain embodiments of circuitry as shown in FIG. 1 have two digital-input-signal pads: a first digital-input-signal pad 130 and a second digital-input-signal pad. The input pin configuration is shown in further detail below with reference to FIG. 5. Some embodiments having two digital-input-signal pads are configured with the configuration circuitry 150 and the digital-input processing circuitry 140 such that first of the two digital-input-signal pads assesses the first group of several states of information 155, and the second of the digital-input-signal pads assesses the at least two additional states of information 160. Additionally, various embodiments have additional capabilities in that the configuration circuitry 150 and the digital-input processing circuitry 140 are configured and arranged to assess four states of information, as further described below, and to decode related information conveyed over the at least one digital-input-signal pad 130. In other embodiments, the configuration circuitry 150 and the digital-input processing circuitry 140 assess five states of information and decode related information conveyed over the at least one digital-input-signal pad 130.

Figure 5:
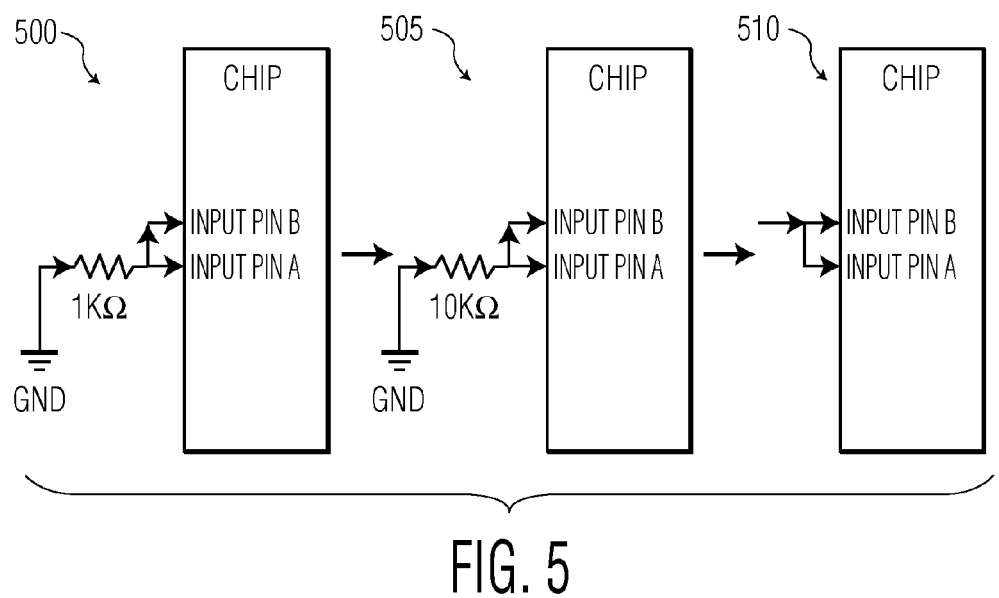
FIG. 5 shows an example embodiment of two input pins and shorting configurations thereof, in accordance with aspects of the instant disclosure.

Further, in certain embodiments of apparatuses, the configuration circuitry 150 and the digital-input processing circuitry 140 designed with a first digital-input-signal pad and a second digital-input-signal pad, as shown in FIG. 5, to decode four states of information from the information conveyed over the first digital-input-signal pad and the second digital-input-signal pad. Other embodiments of the configuration circuitry 150 and the digital-input processing circuitry 140 are designed with a first digital-input-signal pad and a second digital-input-signal pad to decode five states of information from the information conveyed over the first digital-input-signal pad and the second digital-input-signal pad.

In certain embodiments, the other circuit 135 is external to the integrated circuit 100, and is connected to the at least one digital-input-signal pad 130. Further, the binary logic circuitry 140 in those embodiments has a plurality of amplifiers, as shown in more detail below with reference to FIG. 2 for example, to facilitate decoding of one or more of at least four states by a voltage level of the signals received at the at least one digital-input-signal pad.

Figure 2:
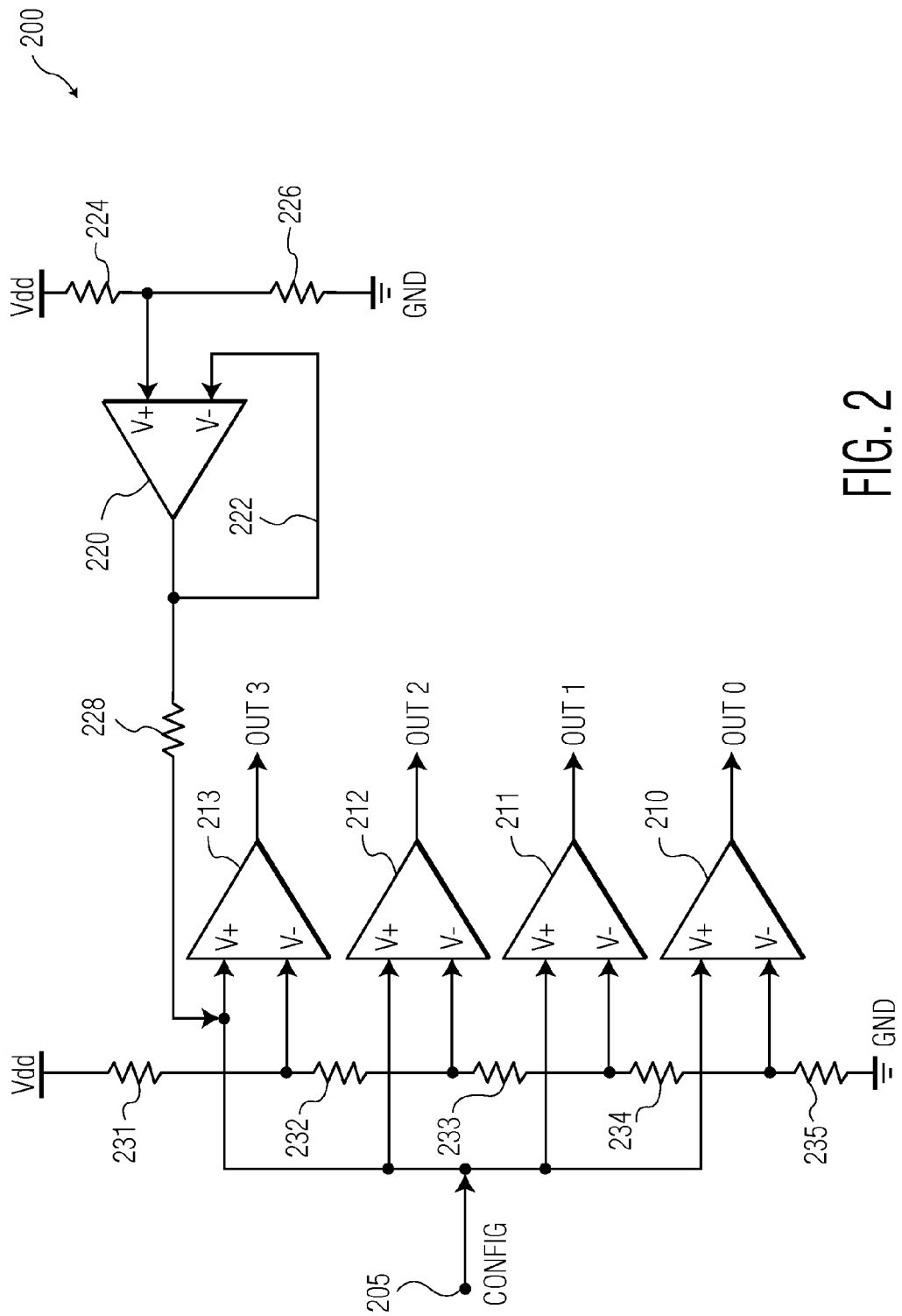
FIG. 2 shows a quinary input circuit, in accordance with an example embodiment of the present invention.

FIG. 2 shows a quinary (five) input state detection circuit 200 is configured to provide binary outputs to characterize a type of input circuit connected to an input pin 205, in accordance with another example embodiment of the present invention. The state detection circuit 200 includes a plurality of comparators including comparators 210-213 that respectively provide binary outputs 0-3, which collectively provide an indication of the state of the input pin 205 via the signal received thereat. This state corresponds to a type of input circuit coupled to the input pin 205. The comparators can be a plurality of amplifiers, which facilitate decoding of a voltage level of the signal.

The input pin 205 is connected to the high voltage (V+) input terminals of the comparators 210-213, as well as to the output of a negative-feedback operational amplifier 220 and its low (V−) input terminals via feedback loop 222. The high input terminal of operational amplifier 220 is coupled between $V_{DD}$ via resistor circuit 224 and ground via resistor circuit 226 for providing a reference level. The low input terminal of operational amplifier 220 is coupled to the output of the amplifier 220 as (negative-feedback) unity gain path, and also to resistor circuit 226.

The high input terminals of comparators 210-213 are interconnected to the other side of resistor circuit 226 to permit the amplifier 220 for feeding a voltage (power-related) adjustment signal thereto in response to the power signal, Vdd. The low input terminals of comparators 210-213 are coupled between $V_{DD}$ and ground, with resistor circuits between the connections. Specifically, resistor circuit 231 is coupled between $V_{DD}$ and the low input terminal of comparator 213, resistor circuit 232 is coupled between the low input terminals of comparators 213 and 212, resistor circuit 233 is coupled between the low input terminals of comparators 212 and 211, resistor circuit 234 is coupled between the low input terminals of comparators 211 and 210, and resistor circuit 235 is coupled between the low input terminal of comparator 210 and ground.

The input state detection circuit 200 accordingly provides binary outputs (e.g., bits) at 0-3 from the comparators 210-213, to indicate a type of input circuit coupled to the input pin 205. In connection with various embodiments, the input state detection circuit 200 is connected and operated to provide outputs as shown in the following Quinary Input Truth Table. The input condition or state in the Table represents the connectivity of the input pin 205, relative to a type of external circuit connected thereto. The decoded value, in the right-side column reflects the corresponding binary output values output from the comparators 210-213.

TABLE 1

QUINARY INPUT

| Condition | Pin value | Resistor value | Decoded value |
|---|---|---|---|
| 1 | GND | 0 | 000 |
| 2 | GND | 10K | 001 |
| 3 | Float | — | 010 |
| 4 | $V_{DD}$ | 0 | 011 |
| 5 | $V_{DD}$ | 10K | 100 |

These decoded values reflect a state to facilitate identifying the type of external circuit which is in turn used to configure bits in the processing circuit (e.g., the logic circuitry 145) as would otherwise likely require another (dedicated) pin. This decoding/encoding is useful e.g., to identify and/or operate based on the configuration type as selected per the detected configuration bits. Accordingly, the connection of the input pin 205 via short to ground is indicated as state 1; the connection of the input pin 205 via a resistor to ground is indicated as state 2; the connection of the input pin 205 to an open circuit is indicated as state 3; the connection of the input pin 205 via a resistor to $V_{DD}$ is indicated as state 4; and the connection of the input pin 205 via short to $V_{DD}$ is indicated as state 5. In addition, by detecting the values at respective outputs in sequential combinations of resistors (e.g., starting with output 3), detecting a value of "1" at a particular output can be used to discern that the remaining outputs (in descending order) also have a value of "1."

In connection with many example embodiments, the input state detection circuit 200 may further include or otherwise provide an output indicative of the state of the pin 205. For example, a decoder circuit can be implemented with or as part of the input state detection circuit 200 (e.g., within the IC), and used to generate an output indicative of the state number as shown. Similarly, a decoder circuit can also be implemented to generate an output that configures one or more circuits using the input circuit coupled to the input pin 205 under operational conditions.

Various configurations can be achieved using different numbers of input pins. For example, the next table shows a number of input pins used to achieve different configurations, relative to the number of states:

TABLE 2

| | Pin Configuration | | | |
|---|---|---|---|---|
| No. of | Number of Pins | | | |
| Configurations | 2 states/pin | 5 states/pin | 10 states/pin | 16 states/pin |
| 10 | 4 | 2 | 1 | 1 |
| 125 | 7 | 3 | 3 | 2 |
| 625 | 10 | 4 | 3 | 3 |
| 3125 | 12 | 5 | 4 | 3 |

These respective configurations can be implemented with the circuits shown in the Figures, such as with FIG. 1 and FIG. 2, and various modifications to include additional (e.g., comparable) circuits to provide two or more input pins and related comparators to facilitate additional states and configurations (e.g., in detecting five states with a single pin, 25 configurations are programmable with two pins).

Figure 3:
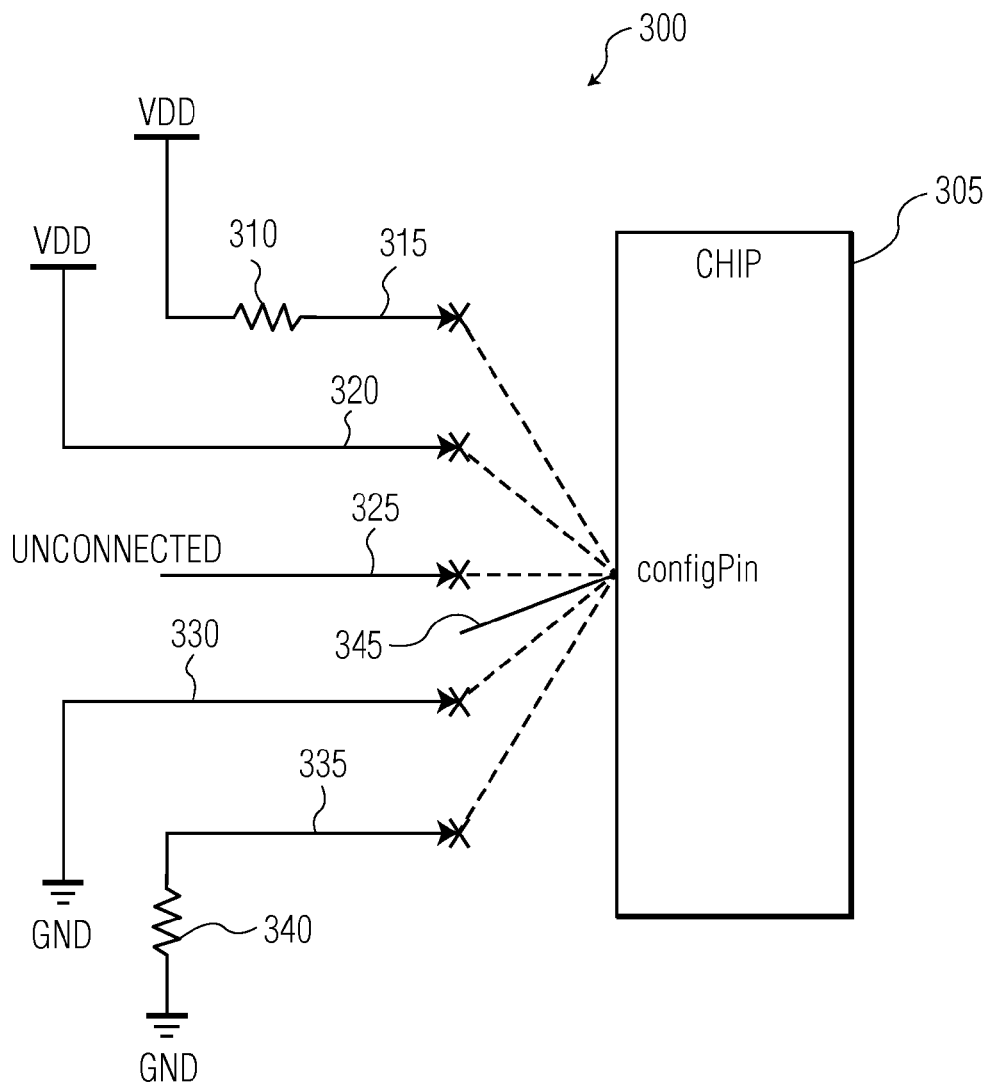
FIG. 3 shows an example input pin circuit in accordance with aspects of the instant disclosure.

Turning now to FIG. 3, which shows an example input pin circuit 300 that may be implemented in connection with the example embodiments described herein, including those shown in and described in connection with FIGS. 1 and 2. For example, the input chips shown in FIG. 3 may be implemented using configuration circuitry/digital-input processing circuitry as shown in FIG. 1, a state detection circuit as shown in FIG. 2, or a combination of such circuits with additional circuitry, such as for decoding the binary outputs or operating with the input circuits. The input pin circuit 300 includes a chip 305 and a switch 345 that can connect the input pin circuit 300 to five different states. For instance, the input pin circuit 300 connects an input to ground 330. This can effectively couple the inputs of the state detection circuit, as shown in FIG. 2B, or the configuration circuitry, as shown in FIG. 1, to ground, setting the outputs of circuits to zero as shown in Table 1 for condition 1. Additionally, the input circuit 300, via the switch 345, can connect the respective inputs to ground 335 via the resistor 340. The outputs are then set as shown in Table 1 for condition 2. Further, the input circuit 300, via the switch 345, can be connected to an open circuit 325 (or float). The outputs are set as shown in Table 1 for condition 3. The input circuit 300, via the switch 345, can connect to $V_{DD}$ 315 through a resistor 310. In this configuration, the outputs of comparators are set as shown in Table 1 for condition 4. The input circuit 300, via the switch 345, can also be connected to $V_{DD}$ 320. The outputs are then set as shown in Table 1 for condition 5.

The values of the resistors in the circuit shown in FIGS. 1-3, can be set relative to the expected types of circuits to be detected at the input. Accordingly, the respective values of the resistors may be set based upon an expected use as may relate to a type of resistor, power supply and/or other condition, to facilitate a binary output (e.g., as in Table 1) that represents the detection of both ground and $V_{DD}$ connectivity with and without a resistor in the circuit.

For the quinary states, two inputs can detect twenty-five possible values, ability to short them and detect the short allows 30 possible values to be detected. This increases the number of states by 20%. Additionally, aspects of the instant disclosure extends the number of values that can be detected when two or more pads are present without adding a great amount of logic by adding an extra detection state which detects if two inputs are connected together in addition to having the five allowed quinary states. For instance, having 2 of the pads allows for detection of twenty-five different combinations (5×5=25). In instances where more sensing is needed, additional pads can be added to allow for more combinations. Aspects of the instant disclosure extend the number of combinations that can be detected by allowing a combination that allows two inputs to be shorted to each other, adding five more states to be detected and increasing the total number of states that can be detected to thirty.

Figure 4:
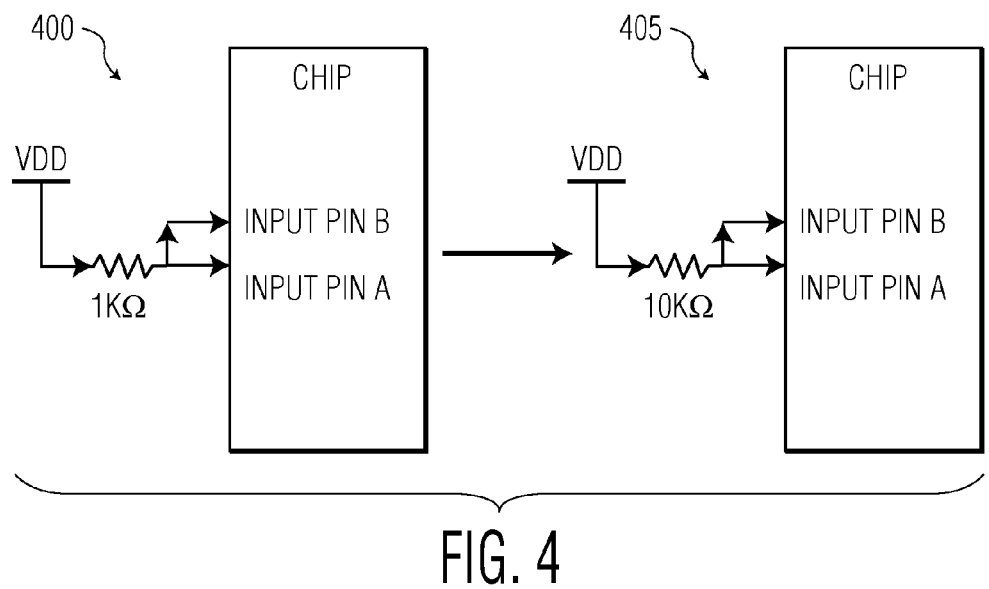
FIG. 4 shows an example embodiment of two input pins and shorting configurations thereof, in accordance with aspects of the instant disclosure.

In addition to using quinary pads that can detect five levels (by connecting to $V_{dd}$, ground, open, pullup, pulldown), aspects of the instant disclosure include the capability of detecting one more features (e.g., two inputs connected together), which increase the number of states that can be detected, without adding logic to the current quinary pads. Such features are illustrating in FIG. 4 and FIG. 5 showing an example embodiment of two pads that can be shorted together. FIG. 4 and FIG. 5 show five additional possibilities of quinary outputs with an added short detection: pads A and B shorted together and configuration circuitry/state detection circuitry shorted to $V_{DD}$ 400; pads A and B shorted together and configuration circuitry/state detection circuitry shorted through a resistor to $V_{DD}$ 405; pads A and B shorted together and configuration circuitry/state detection circuitry shorted to ground 500; pads A and B shorted together and configuration circuitry/state detection circuitry shorted through a resistor to ground 505; and pads A and B shorted together and configuration circuitry/state detection circuitry shorted to float 510. FIG. 4 and FIG. 5 may be implemented in connection with the example embodiments described herein, including those shown in and described in connection with FIGS. 1 and 2. For example, the input chips shown in FIG. 3 may be implemented using configuration circuitry/digital-input processing circuitry as shown in FIG. 1, a state detection circuit as shown in FIG. 2, or a combination of such circuits with additional circuitry, such as for decoding the binary outputs or operating with the input circuits.

In instances where two or more pads are utilized, it can be determined if the pads are connected to each other. For instance, using two pads as an example and assuming the pads are connected to each other, a first high signal is driven out on a first pad, and the status of a second pad is checked (for 1). Next a low signal is driven on the first pad, and the status of the second pad is checked for zero. If both the above conditions are true, then the first and second pad are connected together, and this extra information can be sent on the two pads signals. This is shown in FIG. 4 and FIG. 5, and Table 3.

Table 3 shows the possibilities of sensing utilizing two quinary pads.

TABLE 3

TWO QUINARY INPUTS WITH SHORT DETECTION

| Condition | Pin A | Pin B | A decoded | B decoded | A and B shorted |
|---|---|---|---|---|---|
| 1 | Short to GND | Short to GND | 000 | 000 | 0 |
| 2 | 10k to GND | Short to GND | 001 | 000 | 0 |
| 3 | Float | Short to GND | 010 | 000 | 0 |
| 4 | Short to VDD | Short to GND | 011 | 000 | 0 |
| 5 | 10K to VDD | Short to GND | 100 | 000 | 0 |
| 6 | Short to GND | 10k to GND | 000 | 001 | 0 |
| 7 | 10k to GND | 10k to GND | 001 | 001 | 0 |
| 8 | float | 10k to GND | 010 | 001 | 0 |
| 9 | Short to VDD | 10k to GND | 011 | 001 | 0 |
| 10 | 10K to VDD | 10k to GND | 100 | 001 | 0 |
| 11 | Short to GND | float | 000 | 010 | 0 |
| 12 | 10k to GND | float | 001 | 010 | 0 |
| 13 | float | float | 010 | 010 | 0 |
| 14 | Short to VDD | float | 011 | 010 | 0 |
| 15 | 10K to VDD | float | 100 | 010 | 0 |
| 16 | Short to GND | Short to VDD | 000 | 011 | 0 |
| 17 | 10k to GND | Short to VDD | 001 | 011 | 0 |
| 18 | float | Short to VDD | 010 | 011 | 0 |
| 19 | Short to VDD | Short to VDD | 011 | 011 | 0 |
| 20 | 10K to VDD | Short to VDD | 100 | 011 | 0 |
| 21 | Short to GND | 10K to VDD | 000 | 100 | 0 |
| 22 | 10k to GND | 10K to VDD | 001 | 100 | 0 |
| 23 | float | 10K to VDD | 010 | 100 | 0 |
| 24 | Short to VDD | 10K to VDD | 011 | 100 | 0 |
| 25 | 10K to VDD | 10K to VDD | 100 | 100 | 0 |
| 26 | Short to GND | Short to GND | 000 | 000 | 1 |
| 27 | 10k to GND | 10k to GND | 001 | 001 | 1 |
| 28 | float | float | 010 | 010 | 1 |
| 29 | Short to VDD | Short to VDD | 011 | 011 | 1 |
| 30 | 10K to VDD | 10K to VDD | 100 | 100 | 1 |

As shown in Table 3, and displayed in FIG. 5, five additional states can be detected if the two quinary inputs are shorted (numbered 26 through 30). The short detection can be simply indicated by one extra signal called A and B shorted. In utilizing more than two inputs, detection can be made to check various pairs of pads being shorted together.

Aspects of the instant disclosure can be utilized in application where quinary pads are used and can help lower the number of quinary pads required. For example, the quinary input can be used in devices in products having a high speed interface (e.g., Mobile Phones, eBooks and Tablets), and system management in IIC devices.

Figure 6:
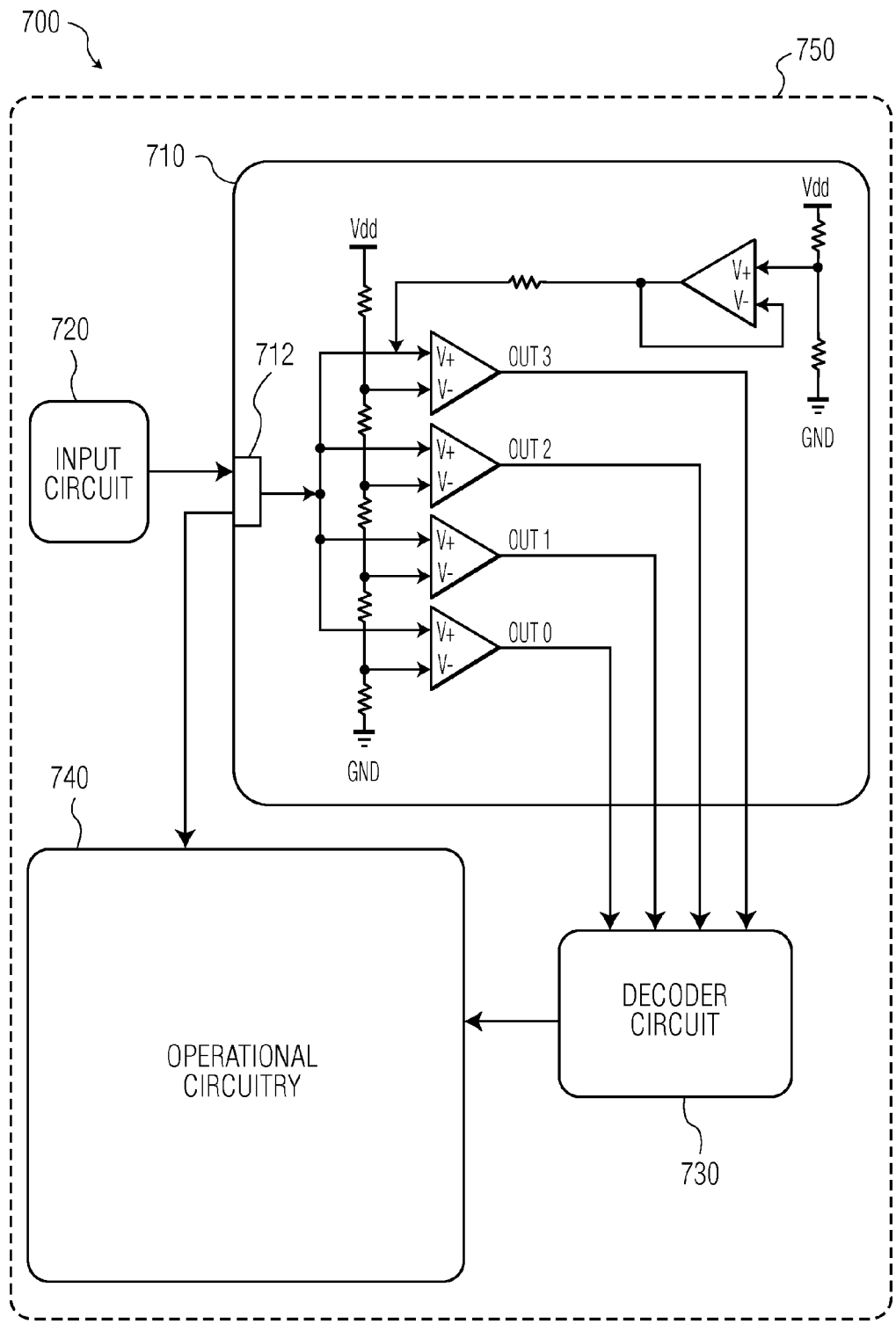
FIG. 6 shows a circuit arrangement including an input circuit, input pin state detection circuit, decoder and operational circuitry, in accordance with other example embodiments of the present disclosure.

FIG. 6 shows a circuit arrangement 700 including an input state detection circuit 710 coupled at a single input pin 712 to an input circuit 720 (or selectively to a plurality of such circuits), in accordance with other example embodiments of the present invention. The circuit arrangement 700 further includes a decoder circuit 730 and operational circuitry 740 (e.g., one or more circuits that operate with the input circuit 720). The respective state detection circuit 710, input circuit 720, decoder circuit 730 and operational circuitry 740 may be implemented in one or more common circuits, with an integrated circuit chip 750 shown by way of example.

As discussed above, the decoder circuit 730 may be integrated with the state detection circuit 710. The decoder circuit 730 is coupled to receive the outputs of comparators in the state detection circuit 710, and to use outputs to determine the type of the input circuit 720. For example, where the state detection circuit 710 is used to detect the connectivity of input circuits as shown in FIG. 3, the outputs can be analyzed in a manner commensurate with the approach shown in and described in connection with Table 1. This determined type is then used, directly by the decoder circuit and/or by other circuitry (740) to control one or more of the connectivity and/or implementation of the input circuit 720.

Figure 7:
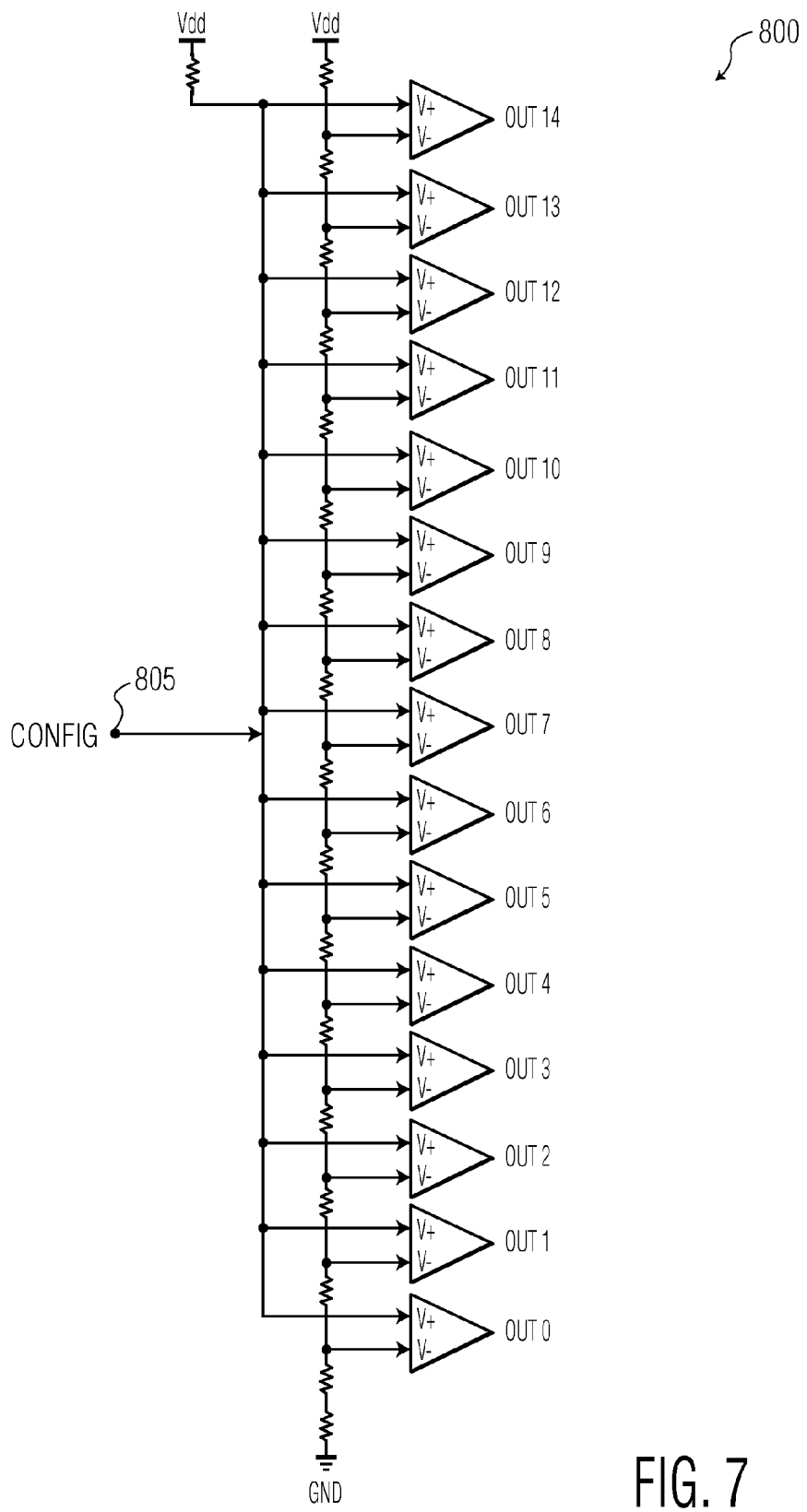
FIG. 7 shows a sixteen-state per pin input circuit, in accordance another example embodiment of the present disclosure.

As discussed above, various numbers of comparators can be used for detecting different combinations of states available at an input pin (or pins). FIG. 7 shows another such approach, similar to that shown in FIG. 2, involving a circuit 800 that is configured to provide 16-state per pin detection, in accordance with various embodiments. An input signal received at an input pin 805 is used via comparator/outputs 0-14 to provide 16 states as follows in Table 4:

TABLE 4

16-State Input Table

| Input R to gnd | \| | \| | \| | \| | \| | Output | \| | \| | \| | \| | \| | \| | \| | \| | State |
|---|---|---|---|---|---|---|---|---|---|---|---|---|---|---|---|---|
| | 14 | 13 | 12 | 11 | 10 | 9 | 8 | 7 | 6 | 5 | 4 | 3 | 2 | 1 | 0 | |
| 0 | 0 | 0 | 0 | 0 | 0 | 0 | 0 | 0 | 0 | 0 | 0 | 0 | 0 | 0 | 0 | 0 |
| 5k | 0 | 0 | 0 | 0 | 0 | 0 | 0 | 0 | 0 | 0 | 0 | 0 | 0 | 0 | 1 | 1 |
| 10k | 0 | 0 | 0 | 0 | 0 | 0 | 0 | 0 | 0 | 0 | 0 | 0 | 0 | 1 | 1 | 2 |
| 15k | 0 | 0 | 0 | 0 | 0 | 0 | 0 | 0 | 0 | 0 | 0 | 0 | 1 | 1 | 1 | 3 |
| 20k | 0 | 0 | 0 | 0 | 0 | 0 | 0 | 0 | 0 | 0 | 0 | 1 | 1 | 1 | 1 | 4 |
| 25k | 0 | 0 | 0 | 0 | 0 | 0 | 0 | 0 | 0 | 0 | 1 | 1 | 1 | 1 | 1 | 5 |
| 30k | 0 | 0 | 0 | 0 | 0 | 0 | 0 | 0 | 0 | 1 | 1 | 1 | 1 | 1 | 1 | 6 |
| 35k | 0 | 0 | 0 | 0 | 0 | 0 | 0 | 0 | 1 | 1 | 1 | 1 | 1 | 1 | 1 | 7 |
| 40k | 0 | 0 | 0 | 0 | 0 | 0 | 0 | 1 | 1 | 1 | 1 | 1 | 1 | 1 | 1 | 8 |
| 45k | 0 | 0 | 0 | 0 | 0 | 0 | 1 | 1 | 1 | 1 | 1 | 1 | 1 | 1 | 1 | 9 |
| 50k | 0 | 0 | 0 | 0 | 0 | 1 | 1 | 1 | 1 | 1 | 1 | 1 | 1 | 1 | 1 | 10 |
| 55k | 0 | 0 | 0 | 0 | 1 | 1 | 1 | 1 | 1 | 1 | 1 | 1 | 1 | 1 | 1 | 11 |
| 60k | 0 | 0 | 0 | 1 | 1 | 1 | 1 | 1 | 1 | 1 | 1 | 1 | 1 | 1 | 1 | 12 |
| 65k | 0 | 0 | 1 | 1 | 1 | 1 | 1 | 1 | 1 | 1 | 1 | 1 | 1 | 1 | 1 | 13 |
| 70k | 0 | 1 | 1 | 1 | 1 | 1 | 1 | 1 | 1 | 1 | 1 | 1 | 1 | 1 | 1 | 14 |
| >75k | 1 | 1 | 1 | 1 | 1 | 1 | 1 | 1 | 1 | 1 | 1 | 1 | 1 | 1 | 1 | 15 |

The resistance value (to ground) is set based upon a normalized resistance used in the respective resistors as shown, with the values shown in Table 4 being exemplary. Different embodiments thus involve variations of these configurations, such as may be effected in accordance with Table 3 above.

Figure 8:
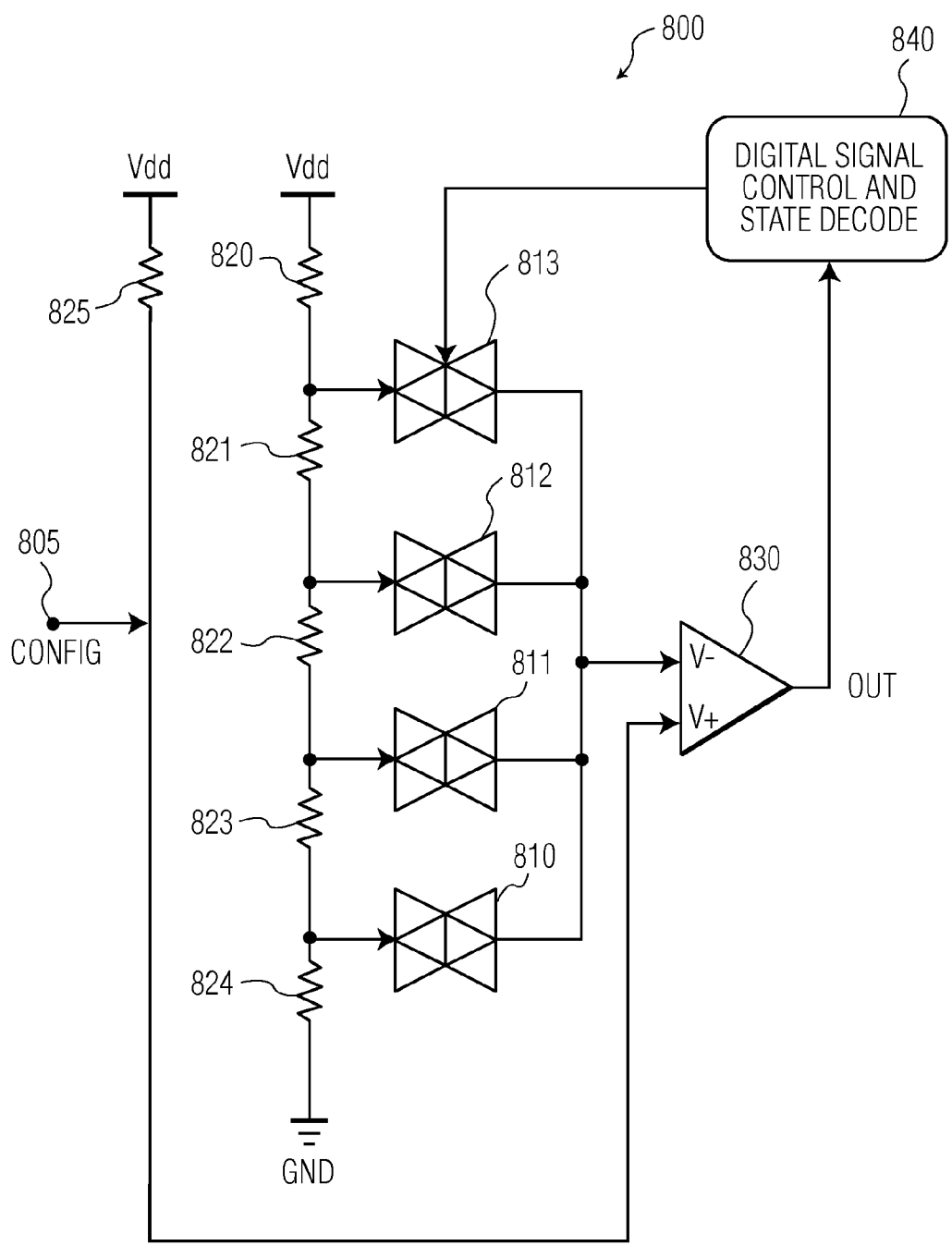
FIG. 8 shows an input pin state detection circuit having a plurality of pass gates feeding a comparator circuit, in accordance with another example embodiment of the present disclosure.

FIG. 8 shows an input pin state detection circuit 800 having a plurality of pass gates feeding a comparator circuit, in accordance with another example embodiment of the present invention. The circuit 800 includes an input pin 805 that receives an incoming signal, such as shown in FIG. 3. A plurality of pass gates 810-813 are connected between $V_{DD}$ and ground via resistors 820-824, and respectively connected to the low input of a comparator 830. The high input of the comparator 830 is connected to $V_{DD}$ via resistor 825, with the input pin 805 being between the high input and the resistor.

A digital signal control/state decode circuit 840 is configured to control the pass gates 810 and 813, and further to receive and decode the output of the comparator 830 for detecting the state at the input pin 805. In some embodiments, the digital signal control and state decode functions carried out at circuit 840 are carried out using separate circuits. By controlling the pass gates 810-813, the low input of the comparator 830 can be coupled as desired between the resistors 820-824, which can be effected in a manner similar to that shown in FIG. 2, to a similar effect with fewer comparators. Accordingly, the circuit 800 can be implemented, for example, in connection with one or more of the circuits shown in FIGS. 2, 7 and 8, with the combined pass gate and comparators used to reduce the number of comparators needed.

When using binary input pads to configure the functions inside an integrated circuit, two configuration choices are present per input. Detection of multiple states supports the ability to detect multiple configurations. Using a standard input pad allows 2 possibilities (i.e., 0 or 1). Detecting four or five states eliminates the need for additional pads to be added when more configuration options are required adding more pads can add to the cost, power, and complexity of the chip. Aspects of the instant disclosure can additionally detect four input states on a single input, rather than the five (quinary) states described in detail above, by utilizing digital logic and on-chip programmable resistors (OCR). In detecting four input states, the detection of the floating condition is removed. In other words, the input states are limited to 0, 1, resistor 0 and resistor 1 (as shown in further detail in Table 5).

TABLE 5

Four Input States

| Condition | Pin value | Resistor value | Decoded value |
|---|---|---|---|
| 1 | GND | 0 | 00 |
| 2 | GND | 100K | 10 |
| 3 | VDD | 0 | 01 |
| 4 | VDD | 100K | 11 |

Figure 9:
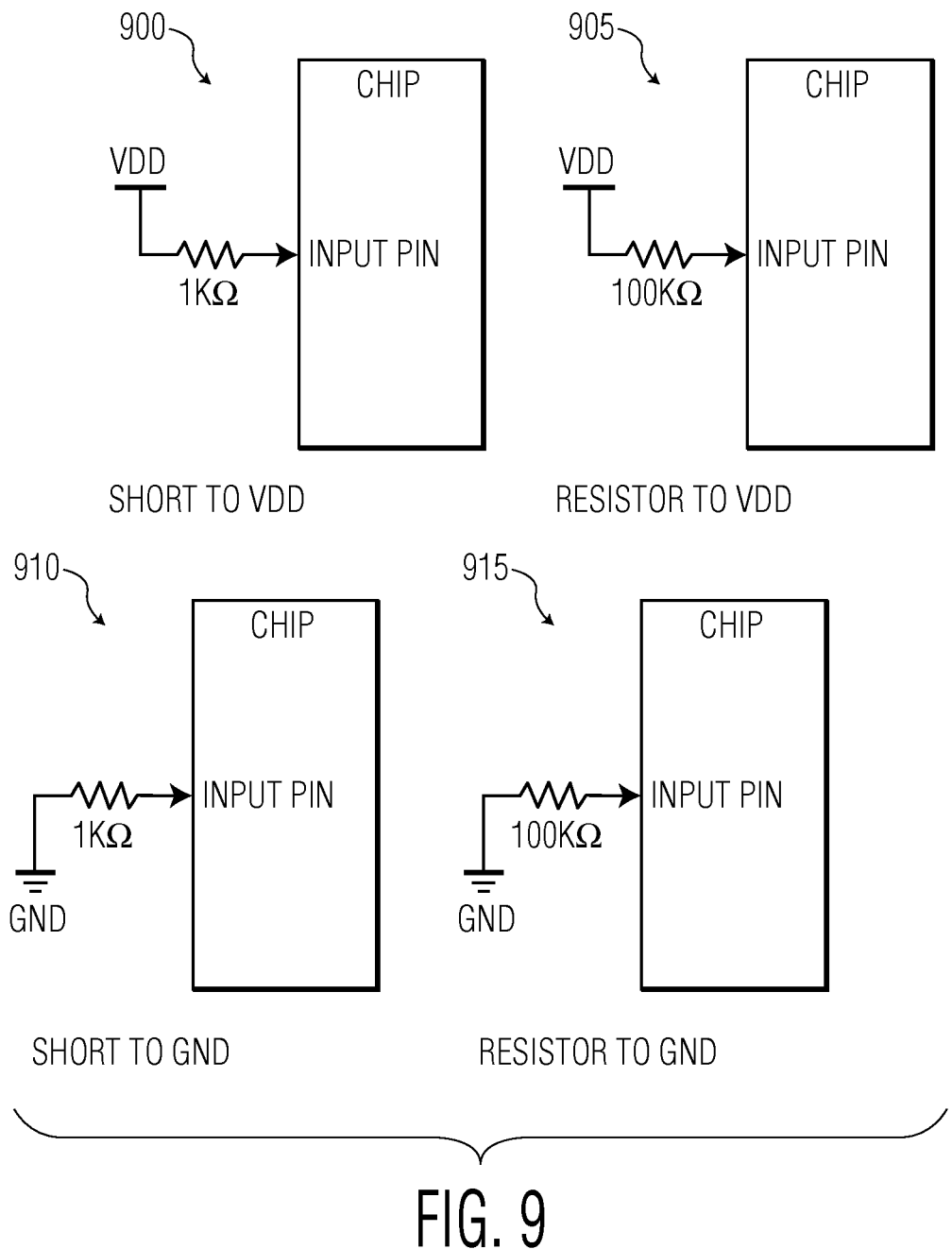
FIG. 9 shows example input pin circuit with four states in accordance with aspects of the instant disclosure.

The removal of float condition allows for a detection mechanism that only requires a controllable resistor which can be switched between the input and $V_{DD}$, ground, or open states. In certain embodiments, the external resistors present to be detected can have a resistance ten times greater than the on-chip programmable resistor. In detection states where there is no external resistor present (i.e., short to $V_{DD}$ or ground), the resistor ratio should be between on-chip programmable resistor divided by ten, and a resistance of zero. The four different detection states are shown in FIG. 9 with the corresponding input pin arrangements. As shown in FIG. 9, similar to FIGS. 3 and 5, the states include: shorting the input pin to $V_{DD}$ 900; connecting the input pin via a resistor to $V_{DD}$ 905; shorting the input pin to ground 910; and connecting the input pin via a resistor to ground 915.

Figure 10:
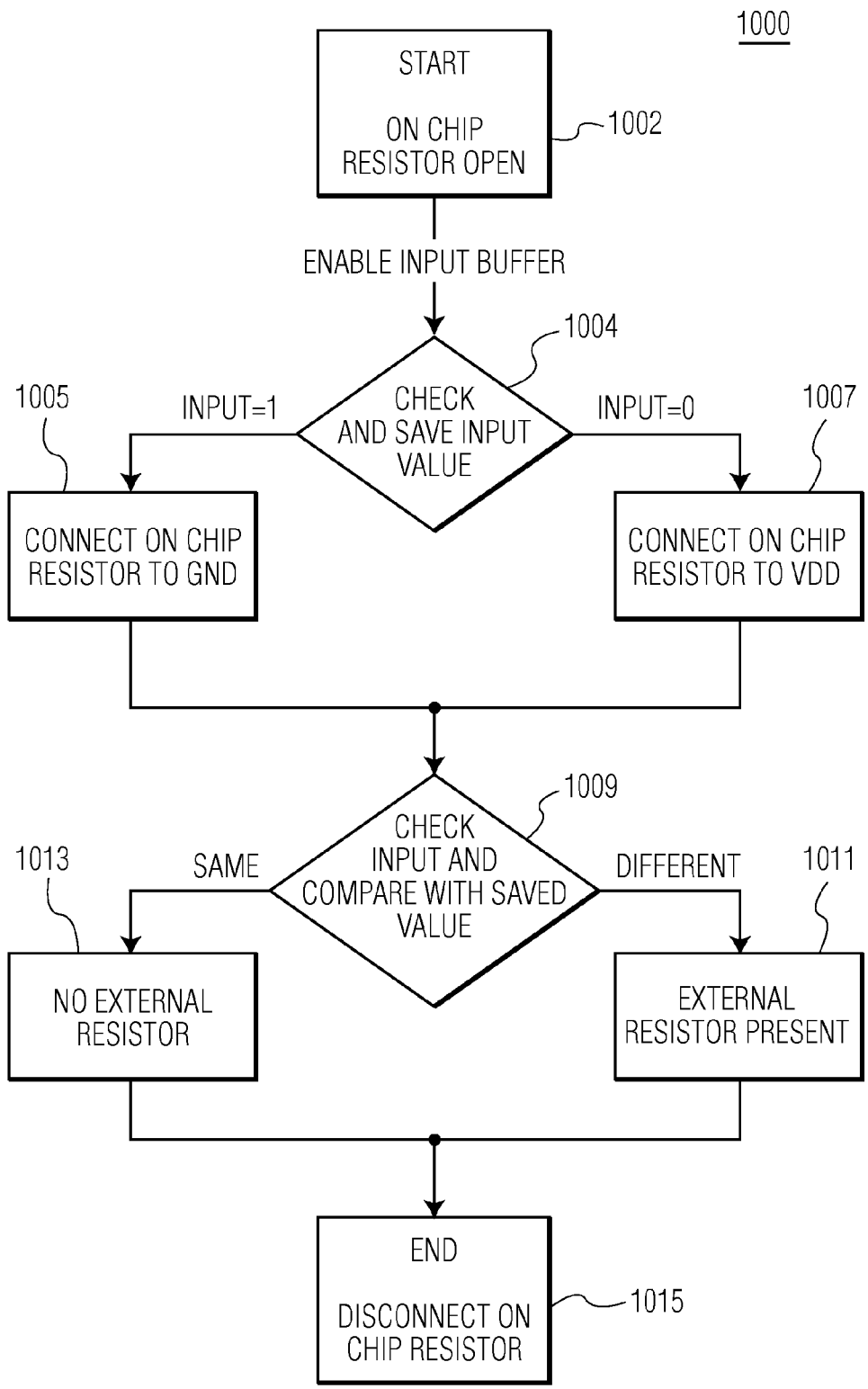
FIG. 10 shows a flowchart of an example detection scheme of a four state detection input circuit, in accordance with aspects of the instant disclosure.

FIG. 10 shows a basic (conceptual) flow chart 1000 for detection using four input states. The flow chart 1000 exemplifies flow for the logic circuitry for controlling modulation of and assessing/detecting the type of circuit connect to the input pin and thereby decoding and, as may be appropriate, configuring the chip in response thereto. The logic circuitry, for example, would correspond to configuration circuitry/digital-input processing circuitry 140 as shown in FIG. 1, the operational circuitry and/or decoder modules/circuitry 740 as shown in FIG. 6.

First, block 1002 depicts the on-chip resistor (e.g., on-chip resistor at 1100 of FIG. 11) being configured so as to be unconnected to the input, thereby providing an open state (i.e., unconnected/floating) for assessing power-related aspects of the input pin. Subsequently, the input buffer (enabled) passes the sensed voltage for decision block 1004 at which the state of the input (pin) is detected using the input binary path (e.g., through amplifier at 1100 of FIG. 11) and the value (1 or 0) is saved. From decision block 1004, flow proceeds either to block 1005 if the input value is logic high (i.e., 1) or to block 1007 if the input value is logic low (i.e., 0). The on-chip resistor can have a resistance that is at a five-to-ten times ratio with the external resistor; therefore, the voltage level present on the input allows a large margin to be easily detected using the binary input.

Figure 11:
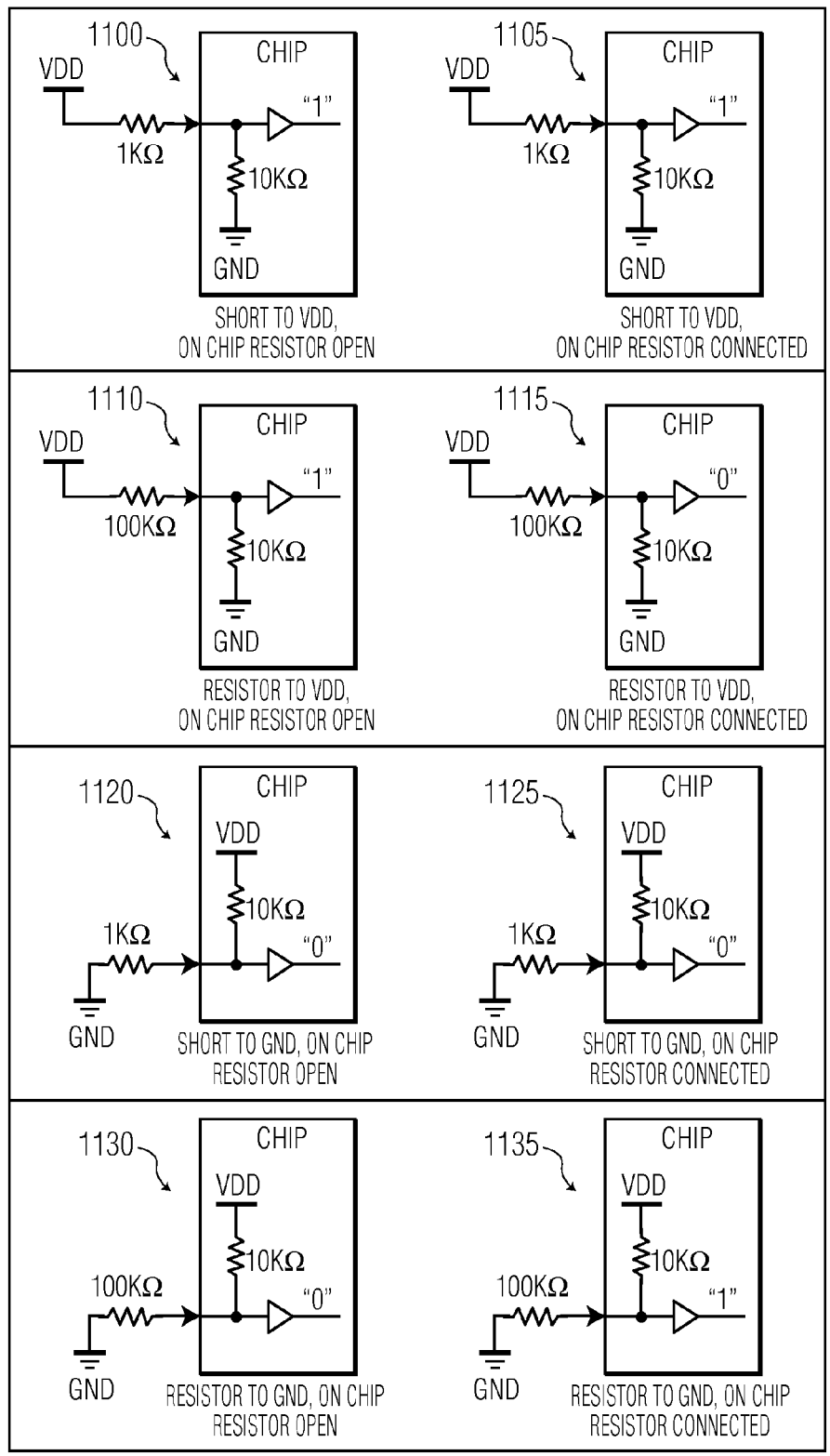
FIG. 11 shows example configurations for the four-state detection input circuit, in accordance with aspects of the instant disclosure.

At block 1005 and with the input value being logic high, the logic circuitry connects the internal on-chip resistor between the input signal and ground (e.g., on-chip resistor at 1105 of FIG. 11). At block 1007 and with the input value being logic low, the logic circuitry connects the internal on-chip resistor between the input signal and $V_{DD}$ (e.g., on-chip resistor at 1125 of FIG. 11). Flow from each of blocks 1005 and 1007 flows to block 1009 where the state of the input pin is checked, by the logic circuitry, and compared with the value (1 or 0) is saved at block 1004. At block 1011, the logic circuit senses that the input changes value is the same as the saved value, and an external high-ohmic resistor is connected to the input pin (e.g., on-chip resistor at 1115 of FIG. 11). At block 1013, the logic circuit senses that the input value is changed from the saved value, and no external high-ohmic resistor is connected to the input pin (e.g., on-chip resistor at 1105 of FIG. 11). At block 1015, the on-chip resistor (e.g., on-chip resistor at 1100 of FIG. 11) is disconnected from the input.

In utilizing four states of detection, the input can always remain enabled, which allows a trigger mechanism to allow input updates as needed. Keeping the input path active allows detection of change in the input state. The external logic that changes external state first takes the signal to opposite value, and then switches to a new value or remains at the opposite value. Therefore, shorting any change in input state (0 to 1 or 1 to 0) causes the detection mechanism to be triggered.

FIG. 11 shows a more detailed connection of an input pin to the four detection states. The 4 detection states shown in FIG. 11 are: shorting the input pin to $V_{DD}$ with the on-chip resistor open 1100; shorting the input pin to $V_{DD}$ with the on-chip resistor connected 1105; connecting the input pin via a resistor to $V_{DD}$ with the on-chip resistor open 1110; connecting the input pin via a resistor to $V_{DD}$ with the on-chip resistor connected 1115; shorting the input pin to ground with the on-chip resistor open 1120; shorting the input pin to ground with the on-chip resistor connected 1125; connecting the input pin via a resistor to ground with the on-chip resistor open 1130; and connecting the input pin via a resistor to ground with the on-chip resistor connected 1135.

As with the input pin circuit shown in FIG. 3, the input circuit shown in FIGS. 9-11 may be implemented in connection with the example embodiments described herein, including those shown in and described in connection with FIGS. 1 and 2. The input chips shown in FIGS. 9 and 11 may be implemented using configuration circuitry/digital-input processing circuitry as shown in FIG. 1, a state detection circuit as shown in FIG. 2, or a combination of such circuits with additional circuitry, such as for decoding the binary outputs or operating with the input circuits.

Various modules may be implemented to carry out one or more of the operations and activities described herein and/or shown in the figures. In these contexts, a "module" is a circuit that carries out one or more of these or related operations/activities. For example, in certain of the above-discussed embodiments, one or more modules are discrete logic circuits or programmable logic circuits configured and arranged for implementing these operations/activities, as in the circuit modules shown in the Figures (e.g., 140, 145 or 150 of FIG. 1; or 710, 730 and 740 of FIG. 6). In certain embodiments, the programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit (e.g., a microcontroller) with one set of instructions and the second module includes a second CPU hardware circuit (e.g., a microcontroller or a programmable logic array) with another set of instructions or configuration data.

Certain embodiments are directed to a computer program product (e.g., nonvolatile memory device), which includes a machine or computer-readable medium having stored thereon instructions which may be executed by a computer (or other electronic device) to perform these operations/activities.

Based upon the above discussion and illustrations, those skilled in the art will readily recognize that various modifications and changes may be made to the present invention without strictly following the exemplary embodiments and applications illustrated and described herein. For example, the input terminals as shown and discussed may be replaced with terminals of different arrangements, and different types and numbers of input configurations (e.g., involving different types of input circuits and related connectivity). In addition, resistors of various values may be used in the input state detection circuits as shown and described, together with different values of Vdd, as relative to other resistors in the circuit and/or of the input circuits of which the resulting input pin state is to be evaluated. Such modifications do not depart from the true spirit and scope of the present invention, including that set forth in the following claims.

What is claimed is:

1. An apparatus comprising:
    an integrated circuit (IC) having a power terminal connected to receive a power signal and having a decoding circuit, the decoding circuit including a signal-adjust circuit configured and arranged to generate a power-related adjustment signal in response to the power signal;
    at least one digital-input-signal pad configured and arranged for communicating digital signals between the integrated circuit and another circuit which is external to the integrated circuit;

digital-input processing circuitry, within the IC and including binary logic circuitry, configured and arranged for receiving the digital signals from the digital-input-signal pad and for processing the received digital signals using the binary logic circuitry; and configuration circuitry configured and arranged for applying the power-related adjustment signal to signals received at the at least one digital-input-signal pad and, in response thereto, for detecting that the digital signals received at the at least one digital-input-signal pad convey information using a first group of a plurality of states of information and at least two additional states of information, wherefrom more than the plurality of states of information in the first group are decoded from the information conveyed over the at least one digital-input-signal pad.

2. The apparatus of claim 1, wherein the configuration circuitry includes analog circuitry configured and arranged to modulate the at least one digital-input signal pad by using the power-related adjustment signal to drive the at least one digital-input-signal pad.

3. The apparatus of claim 1, further including the other circuit which is external to the integrated circuit.

4. The apparatus of claim 1, wherein the configuration circuitry is further configured and arranged for applying the power-related adjustment signal to signals received at the at least one digital-input-signal pad in order to discern whether the digital signals received at the at least one digital-input-signal pad conveys information using a total number of states corresponding to the number of the first group of a plurality of states multiplied by the number of said at least two additional states of information.

5. The apparatus of claim 1, wherein the more than the a plurality of states of information include: a floating input state; a high-level input state; a low-level input state; a low-ohmic input state; and a high-ohmic input state.

6. The apparatus of claim 1, wherein the more than the plurality of states of information include: a floating input state; a high-level state; a low-level state; a low-ohmic high-level input state; a high-ohmic high-level input state; a low-ohmic low-level input state; and a high-ohmic low-level input state.

7. The apparatus of claim 1, wherein the at least one digital-input-signal pad includes a first digital-input-signal pad and a second digital-input-signal pad, the first digital-input-signal pad configured and arranged to convey information using the first group of a plurality of states of information, and the second digital-input-signal pad configured and arranged to convey the at least two additional states of information.

8. The apparatus of claim 7, wherein the first digital-input-signal pad is configured and arranged with the configuration circuitry and the digital-input processing circuitry for assessing the first group of a plurality of states of information and wherein the second digital-input-signal pad is configured and arranged with the configuration circuitry and the digital-input processing circuitry for assessing the at least two additional states of information.

9. The apparatus of claim 1, wherein the configuration circuitry and the digital-input processing circuitry are configured and arranged to assess four states of information and to decode related information conveyed over the at least one digital-input-signal pad.

10. The apparatus of claim 1, wherein the configuration circuitry and the digital-input processing circuitry are configured and arranged to assess five states of information and decode related information conveyed over the at least one digital-input-signal pad.

11. The apparatus of claim 1, wherein the at least one digital-input-signal pad includes a first digital-input-signal pad and a second digital-input-signal pad configured and arranged with the configuration circuitry and the digital-input processing circuitry and wherein four states of information are decoded from the information conveyed over the first digital-input-signal pad and the second digital-input-signal pad.

12. The apparatus of claim 1, wherein the at least one digital-input-signal pad includes a first digital-input-signal pad and a second digital-input-signal pad configured and arranged with the configuration circuitry and the digital-input processing circuitry and wherein five states of information are decoded from the information conveyed over the first digital-input-signal pad and the second digital-input-signal pad.

13. The apparatus of claim 1, wherein the other circuit is external to the integrated circuit and connected to the at least one digital-input-signal pad and the binary logic circuitry includes a plurality of amplifiers configured and arranged to facilitate decoding of one or more of at least four states by a voltage level of the signals received at the at least one digital-input-signal pad.

14. The apparatus of claim 1, wherein the more than the plurality of states of information include: a high-level input state; a low-level input state; a low-ohmic input state; and a high-ohmic input state.

15. An apparatus comprising:
an integrated circuit (IC) having a power terminal connected to receive a power signal and having a decoding circuit, the decoding circuit including a signal-adjust circuit configured and arranged to generate a power-related adjustment signal in response to the power signal;

at least one digital-input-signal pad configured and arranged for communicating digital signals between the integrated circuit and another circuit which is external to the integrated circuit;

digital-input processing circuitry, within the IC and including binary logic circuitry, configured and arranged for receiving the digital signals from the digital-input-signal pad and for processing the received digital signals using the binary logic circuitry; and configuration circuitry configured and arranged for applying the power-related adjustment signal to signals received at the at least one digital-input-signal pad and, in response thereto, for detecting that the digital signals received at the at least one digital-input-signal pad convey information using a first group of a plurality of states of information and at least two additional states of information, wherefrom more than the four states of information, which includes a high-level input state; a low-level input state; a low-ohmic input state; and a high-ohmic input state, are decoded from the information conveyed over the at least one digital-input-signal pad and facilitate identification of the other circuit.

16. The apparatus of claim 15, wherein the four states of information further includes a fifth state of information.

17. The apparatus of claim 16, wherein the five states of information include: a floating input state; a high-level input state; a low-level input state; a low-ohmic input state; and a high-ohmic input state.

18. The apparatus of claim 15, wherein the binary logic circuitry includes a plurality of amplifiers configured and arranged to facilitate decoding of one or more of at least four states by a voltage level of the signals received at the at least one digital-input-signal pad.

19. An apparatus comprising:
- an integrated circuit (IC) having a power terminal connected to receive a power signal and having a decoding circuit, the decoding circuit including a signal-adjust circuit configured and arranged to generate a power-related adjustment signal in response to the power signal;
- a first digital-input-signal pad and a second digital-input-signal pad configured and arranged for communicating digital signals between the integrated circuit and another circuit which is external to the integrated circuit;
- digital-input processing circuitry, within the IC and including binary logic circuitry, configured and arranged for receiving the digital signals from the digital-input-signal pad and for processing the received digital signals using the binary logic circuitry; and
- configuration circuitry configured and arranged for applying the power-related adjustment signal to signals received at the first digital-input-signal pad and the second digital-input-signal pad and, in response thereto, for detecting that the digital signals received at the at least one digital-input-signal pad convey information using a first group of a plurality of states of information and at least two additional states of information, wherefrom more than the four states of information are decoded from the information conveyed over the first digital-input-signal pad, and the second digital-input-signal pad multiplying the four states of information decoded from the information conveyed over the first digital-input-signal pad.

20. The apparatus of claim 19, wherein the binary logic circuitry includes a plurality of amplifiers configured and arranged to facilitate decoding of one or more of at least four states by a voltage level of the signals received at the first digital-input-signal pad and the second digital-input-signal pad.

* * * * *